(12) United States Patent
Apte

(10) Patent No.: US 7,623,169 B2
(45) Date of Patent: Nov. 24, 2009

(54) LOW NOISE CHARGE GAIN HYBRID IMAGER

(75) Inventor: Raj B. Apte, Palo Alto, CA (US)

(73) Assignee: Xerox Corporation, Norwalk, CT (US)

( * ) Notice: Subject to any disclaimer, the term of this patent is extended or adjusted under 35 U.S.C. 154(b) by 1287 days.

(21) Appl. No.: 10/431,255

(22) Filed: May 7, 2003

(65) Prior Publication Data

US 2004/0000632 A1 Jan. 1, 2004

Related U.S. Application Data

(60) Provisional application No. 60/391,659, filed on Jun. 26, 2002.

(51) Int. Cl.
H04N 3/14 (2006.01)
H04N 5/335 (2006.01)
H01L 27/00 (2006.01)

(52) U.S. Cl. ............... 348/294; 348/300; 348/301; 250/208.1

(58) Field of Classification Search ................ None
See application file for complete search history.

(56) References Cited

U.S. PATENT DOCUMENTS

| | | | |
|---|---|---|---|
| 5,742,333 A | 4/1998 | Faris | |
| 5,745,164 A | 4/1998 | Faris | |
| 5,900,623 A * | 5/1999 | Tsang et al. | 250/208.1 |
| 5,945,663 A * | 8/1999 | Bird | 250/208.1 |
| 5,949,483 A * | 9/1999 | Fossum et al. | 348/303 |
| 6,011,274 A | 1/2000 | Gu et al. | |
| 6,252,215 B1 * | 6/2001 | Mei et al. | 250/208.1 |
| 6,359,672 B2 | 3/2002 | Gu et al. | |
| 6,501,087 B1 * | 12/2002 | Koretsune et al. | 250/566 |
| 6,587,142 B1 * | 7/2003 | Kozlowski et al. | 348/241 |
| 6,952,004 B2 * | 10/2005 | Henderson | 250/214 A |
| 7,289,149 B1 * | 10/2007 | Lee et al. | 348/300 |
| 2002/0047086 A1 * | 4/2002 | Pain | 250/208.1 |
| 2002/0153474 A1 * | 10/2002 | Muramatsu et al. | 250/208.1 |
| 2003/0205660 A1 * | 11/2003 | Takahashi et al. | 250/208.1 |
| 2003/0223003 A1 * | 12/2003 | Meynants | 348/294 |

OTHER PUBLICATIONS

Lu, J.P., et al., *Flat Panel Imagers Based on Excimer Laser Annealed, poly-Si Thin Film Transistor Technology*, Jul. 25, 2001.

* cited by examiner

*Primary Examiner*—Lin Ye
*Assistant Examiner*—Temitope Adeyiga
(74) *Attorney, Agent, or Firm*—Fay Sharpe LLP

(57) ABSTRACT

In one aspect of the present application, provided is a charge gain imaging system and a method of operating the charge gain imaging system. The method includes collecting a pixel charge. The collected pixel charge being stored by a pixel capacitance ($C_p$). Thereafter the pixel having the stored pixel charge is selected via a pixel select switch, and the pixel voltage is transferred and stored by data line capacitance ($C_d$) of a data line of the imager. An amplifier select switch is activated connecting the data line to a charge amplifier, and a charge gain defined by a relationship $C_d/C_p$, is sensed by a charge amplifier.

19 Claims, 4 Drawing Sheets

LOW NOISE CHARGE GAIN HYBRID IMAGER

CROSS-REFERENCED APPLICATION

The present application claims priority to U.S. Provisional Application No. 60/391,659, filed Jun. 26, 2002. The contents of that application are hereby incorporated by reference in the present application in their entirety, including all attachments and figures provided therewith.

STATEMENT REGARDING FEDERALLY SPONSORED RESEARCH OR DEVELOPMENT

This invention was made with United States Government support under Agreement No. 70NANB7H3007 awarded by the National Institute of Standards and Technology (NIST). The United States Government has certain rights in the invention.

BACKGROUND OF THE INVENTION

The present application is directed to an improvement in noise performance of imager systems such as, but not limited to, active-matrix flat panel imagers (AMFPI) based on amorphous and/or polysilicon. The described approach achieves an improved imager system, which operates in a charge gain (delivery) mode, and avoids cross-talk and other noise.

In a conventional amorphous silicon (a-Si) imager, a signal charge is transferred from a photodiode or hold capacitor through a single transistor to a data bus, connected to a charge detector. By holding the data bus voltage constant, charge is transferred to a charge detector circuit. Recently, work has been undertaken related to hybrid imagers. This type of imager uses transistors having distinct design configurations, and which may be made from different materials. The use of multiple transistors allows pixel gain, which can reduce the cost of the system electronics. For example, in one embodiment the hybrid imager may employ, but is not limited to, amorphous Si (a-Si) and polycrystalline-silicon (p-Si) transistors. The hybrid design enables pixels of the imager to increase (i.e., add a gain to) the generated signal. One particular type of hybrid imaging system uses a voltage amplifier, such as a source follower within a pixel that converts a signal to a voltage on a data bus. This same configuration can also be used to covert a signal to a current on a data bus. In this configuration, the amplifier is called a cascode. The difference between these two methods is determined by the impedance of the data bus: high for the voltage follower, low for the cascode amplifier.

Both of these systems suffer from drawbacks. The cascode is quite non-linear, and to linearize the system requires additional signal processing or the integration of additional electronic components within the pixel or detector circuit. The source follower has been used more successfully. It transfers the pixel voltage to the data bus with a fixed offset. But this method of operation requires a high data bus impedance. Although methods of shielding are known in the art of electronics, it is very difficult to shield distributed electronic systems, such as large area imagers, against electromagnetic interference. Thus the designer of pixel-gain imagers must choose between non-linearity or interference.

SUMMARY OF THE INVENTION

In one aspect of the present application, provided is a method of operating a charge gain hybrid imaging system. The method includes collecting a pixel charge. The collected pixel charge is stored by a pixel capacitance. Thereafter the pixel having the stored pixel charge is selected via a pixel select switch, and the pixel voltage is transferred and stored on the data line capacitance of a data line of the imager. This charge is $C_d/C_p$ times the pixel charge. An amplifier select switch is activated connecting the data line to a charge amplifier, and a charge gain defined by a relationship $C_d/C_p$, is sensed by a charge amplifier.

In another embodiment of the present application, provided is an imager having a pixel including a photoconductor configured to detect light and convert the detected light into a photoconductor output signal. A voltage amplifier is connected to receive and amplify the photoconductor output signal, and a pixel capacitance stores a pixel charge generated by the photoconductor. A select switch is connected to the voltage amplifier, which in turn is connected to a data line, wherein by turning on the select switch the pixel charge is transferred to the data line. This transfer causes the pixel charge to be stored as a data line charge by data line capacitance. A charge amplifier select switch is connected at one end to the data line, and the charge amplifier is connected to a second end of the charge amplifier select switch. By this arrangement, a charge is provided to the charge gain amplifier, the charge being defined as a ratio of a data line charge ($C_d$) and a pixel charge ($C_p$), which provides a pixel signal gain ($C_d/C_p$).

DETAILED DESCRIPTION OF THE INVENTION

The following discussion is directed to a low noise hybrid imager system where detected signals include a pixel-level signal charge to voltage transduction. More particularly, this application describes the use of a data bus capacitance to realize interference-immune, linear charge detection.

Figure 1:
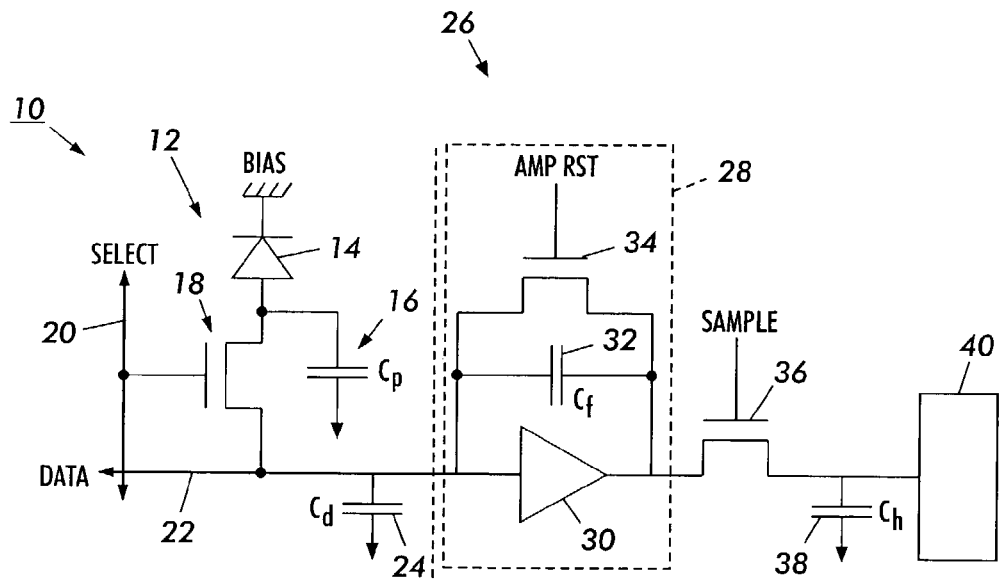
FIG. 1 illustrates existing architecture for a portion of an a-Si imager.

In conventional active matrix a-Si imagers, a signal charge is transferred from a photodiode, photoconductor, gap cell, or other detector through a single transistor to the data bus, which is in turn connected to a charge detector (i.e., a charge or voltage amplifier). A circuit design 10 of this type is illustrated in FIG. 1, and includes a single switch pixel 12, having a detector 14, such as a photodiode, a pixel capacitance ($C_p$) 16 which stores the generated pixel charge, and a transistor 18 configured as an active matrix switch which is used to switch the detector 14 output. A gate or select line 20 provides energization to transistor 18. A data line 22 provides a connection to transistor 18, and includes a data line capacitance ($C_d$) 24. Both $C_p$ and $C_d$ may be composed of parasitic (or intrinsic) as well as designed (extrinsic) capacities. External charge detector electronics 26 includes a charge amplifier 28 with amp 30, capacitance feedback ($C_f$) 32, amplifier reset switch 34, sample-and-hold switch 36, hold capacitance ($C_h$)

38 and signal processing electronics 40. It is to be appreciated a full imager includes a one or two dimensional matrix of the illustrated pixels and associated circuitry.

In operation, a pixel charge is collected in pixel 12 and is stored by pixel capacitance 16. Pixel 12 is then selected by activation of select line 20 and the charge in pixel capacitance 16 is transferred to data line capacitance 24. The charge of the data line capacitance is then detected by charge sensitive amplifier 28. As noted, FIG. 1 illustrates only a portion of a full imager. In a full imaging system, each row of the imager is selected, by a select switch, and the signal charge from the pixels in that row are transferred to the corresponding data line capacitance. Thereafter, charge on the data lines is detected by a corresponding charge-sensitive amplifier. In ideal conditions the charge generated on capacitance feedback 32 is equal to the charge detected in the pixel detector 14. After the column is read, the system may then read out other columns in sequence until all the pixels in a two dimensional array have been read.

Figure 2:
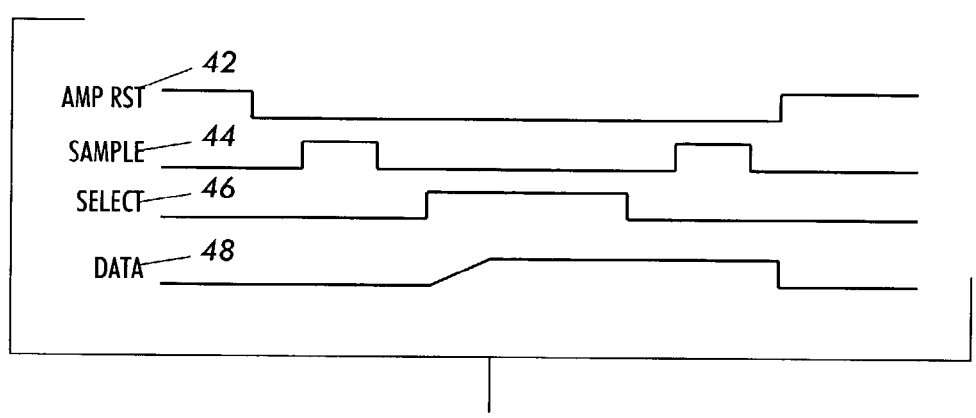
FIG. 2 depicts timing sequences for the architecture of FIG. 1.

FIG. 2 depicts various timing signals which correlate to actions occurring within the circuit of FIG. 1. Two sample and hold operations are undertaken by sample switch 36, which follows the charge amplifier 28, in order to perform a double correlated sampling operation (DCS). Particularly, in FIG. 2, following AMP RST signal 42 moving from an active to an inactive level, Sample signal 44 transitions to an active state momentarily. This action captures the first, background sample on the hold capacitor 38, which may be read by the signal processing electronics 40 subsequently. Thereafter, Select signal 46 is generated. Issuance of the Select signal 46 permits charge stored on the pixel capacitance ($C_p$) to be transferred to the data line. This results in charge amplifier 28 sensing the signal on data line 22. Sensing of the data on data line 22 causes the data signal 48 to transition to a voltage equal to the pixel voltage at detector 14 times $C_p/C_p$. Thereafter, a second Sample signal 44 is issued. The signal lines in FIG. 2 assume the operations occur without loss of generality n-MOS TFTs. It is noted that p-MOS devices can be substituted for n-MOS in much or all of the described circuit for low noise or ease of fabrication.

Turning now more specifically to concepts of the present application, to attain low noise, linear operation in a charge type hybrid imager, the data line voltage is kept constant by a charge amplifier, preventing cross-talk from one data line into the rest of the system. A second aspect for low noise operation is that data impedance is made low, reducing coupling from the rest of the system and any external pickup. The reduced pickup is particularly useful for large imagers, which, as the metal conductors become larger, will undesirably act as antennas for radio frequency (RF) systems, increasing system noise. While this noise may be diminished by inclusion in a metal-shielded box, this adds to system costs, and when the imagers are very large, the shielding becomes impractical.

Figure 3:
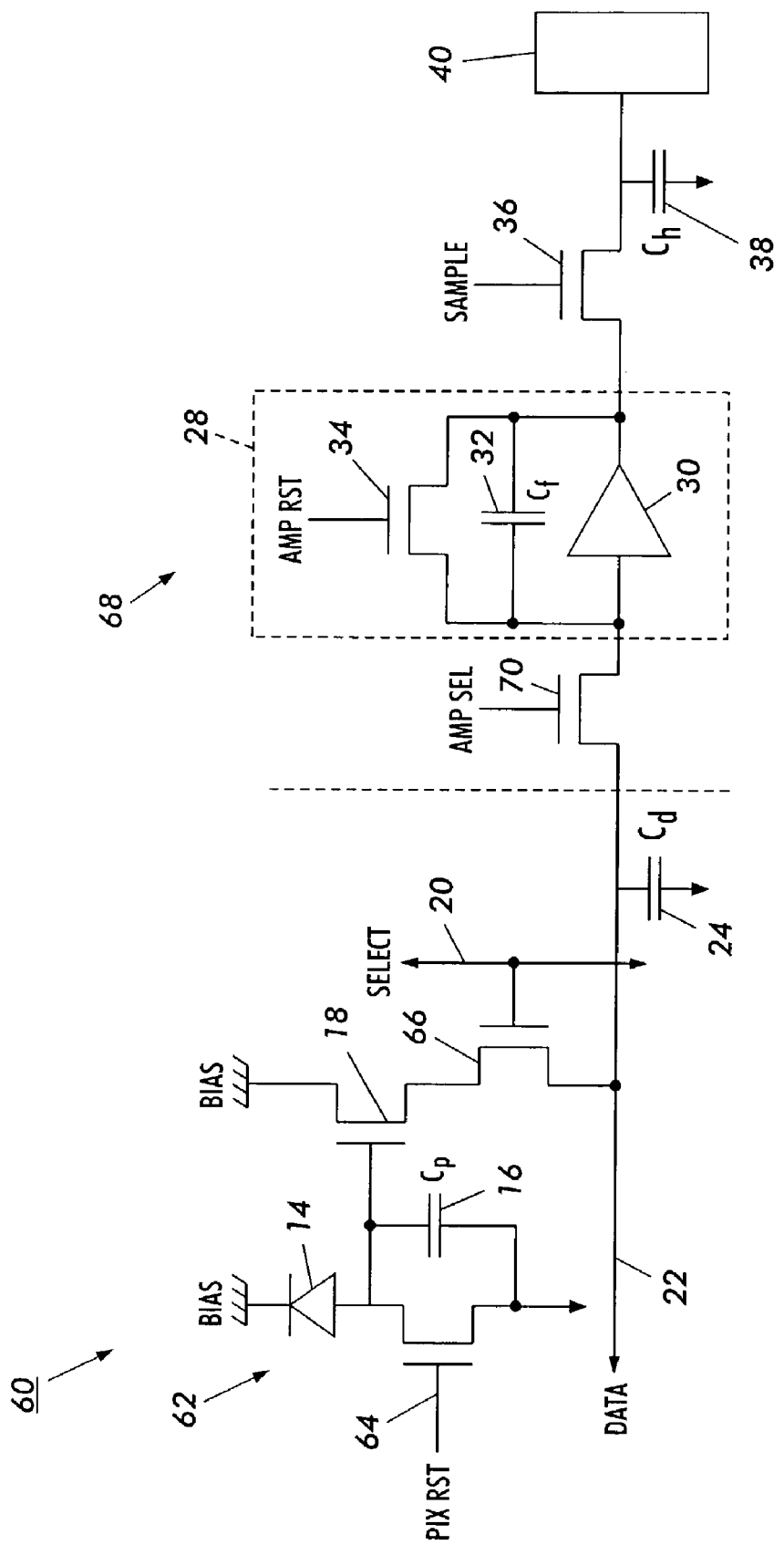
FIG. 3 sets forth a portion of a hybrid imager using a pixel with a source follower amplifier in accordance with the present application.

With attention to FIG. 3, illustrated is a portion of a hybrid imager 60 according to the concepts of the present application. In this discussion, elements comparable to those discussed in FIG. 1 are provided with the same number.

Pixel 62 incorporates a pixel reset switch (PIX RST) 64, connected at one end to detector 14 and at the other to a discharge bus, which may be ground. In one embodiment, pixel reset switch 64 may be a double gate poly-Si TFT reset switch although other switches may also be used. Pixel capacitance ($C_p$) 18 is shown connected across pixel reset switch 64. Upon initiation of a new operation, pixel reset switch 64 is activated to remove any remaining charge in the pixel. Transistor 16, configured as a voltage amplifier (which in one mode may be configured as a source follower) is connected to a pixel selection switch 66. In one embodiment, the switch 66 may be a doublegate TFT pixel selection switch, although other types of switches may also be used. Remaining elements in pixel 62 are similar to those as described in FIG. 1.

Added to external electronics 68 is an amplifier select switch (AMP SEL) 70, which provides selective connection between the pixel 62 and charge amplifier 28. Amplifier select switch 70 may in one embodiment be a TFT transistor on the imager substrate, or a c-Si MOSFET on a readout amplifier IC, which may connect a plurality of data lines (not shown) to external charge amplifier 28. As previously noted, the pixel capacitance ($C_p$) 16 and data line capacitance ($C_d$) 24 may be intrinsic (parasitic) or extrinsic, or a combination thereof. This imager design is, as in FIG. 1, provided as a source follower.

Figure 5:
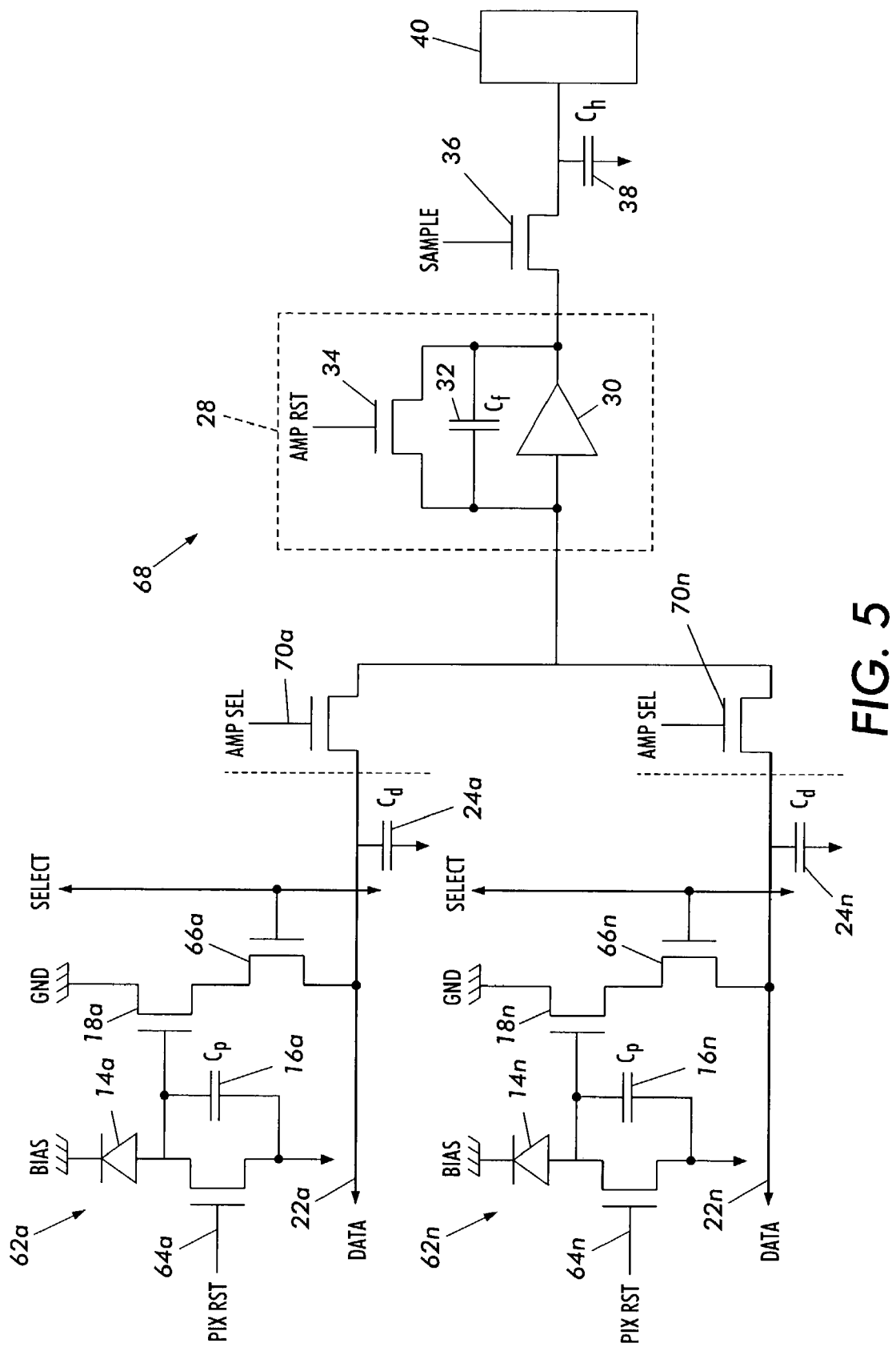
FIG. 5 illustrates a circuit for a multiplex source follower pixel with a charge readout in accordance with the present application.

It is appreciated that FIG. 3 shows a single pixel arrangement in accordance with the present application. FIG. 5 discloses a multiplexing arrangement, where a plurality of pixel represent a matrix and wherein multiplexing of the rows may be obtained in accordance with the present application.

The pixel 62 of FIG. 3 may function in a current mode. In the current this mode of operation, the circuit operates at a low impedance output, i.e., a signal current. A drawback of the current mode operation is that it suffers from nonlinearity of the TFT drain current versus the gate voltage characteristics. Therefore, the common mode of operation for transduction in a source follower design such as shown in FIGS. 1 and 3 is the use of signal voltage. However, the high impedance of such a system, makes capacitive interference a problem. Therefore, additional operational characteristics and components as mentioned above are provided in the embodiment of FIG. 3 to address the high impedance issues.

In one embodiment of the present application, provided is a method of using imager 60 of FIG. 3 to charge up the data line capacitance resulting in a charge gain of $C_d/C_p$, which is supplied to charge amplifier 28. A distinction between the circuit of FIG. 1 and the circuit of FIG. 3 is the addition of an amplifier select switch 70 placed in series between data line 22 and charge amplifier 28. Turning off the amplifier select switch 70, when an associated pixel 62 is selected, allows the source follower transistor 18 to drive the voltage on the data line 22 where it is stored on the data line capacitance 24. The charging of the data line in this state is close to the gate voltage of voltage transistor 18, minus its threshold voltage.

In the mode of operation for this embodiment, DCS operations may be performed as before, however during the time the Select line 20 permits the data line 22 to be charged, amplifier select switch 70 is kept off. This results in isolating pixel 62 from charge amplifier 28. Once the data line 22 has been charged, the amplifier select switch 70 is asserted and the charge amplifier 28 detects the full data line charge ($C_d$). In many imagers it is common for the data line charge ($C_d$) to be many times larger than the pixel charge, whereby the gain generated, as referenced to the pixel, will be increased by the ratio of $C_d/C_p$.

Figure 4:
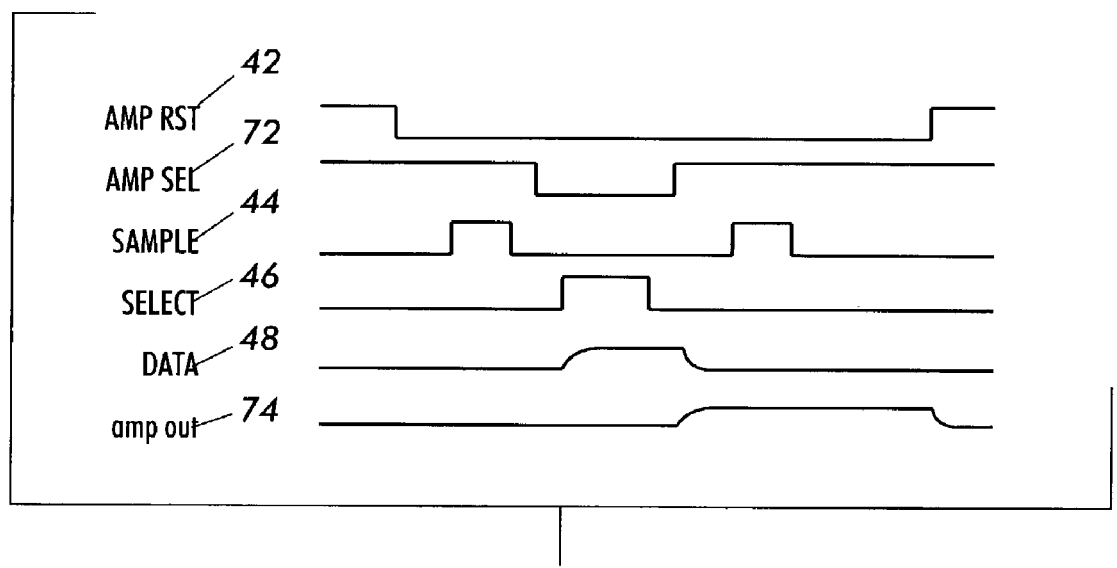
FIG. 4 sets forth a timing signal sequence for the circuit of FIG. 3.

A feature of the described method of charge gain is that it preserves the ability of DCS to cancel the reset noise of the charge amplifier 28. This operation may be seen in connection with FIG. 4. When AMP RST signal 42 is inactive, a partition is made and a gate-source capacitive charge (Of) is injected into the front end of charge amplifier 28. This charge is detected by first Sample signal 44. Because AMP SEL signal 72 transitions before second Sample signal 44 is generated, no net portion of feed-through charge from AMP SEL signal 72 is able to disturb the DCS. After the second Sample signal 44 is issued, charge amplifier 28 and pixel 62 may both be reset by operation of amplifier reset switch 34 and pixel reset switch 64, before sampling the next line of data.

In the presently described method, the capacitances of the data lines (e.g., data line 22) are being used advantageously, whereas in existing systems these data line capacitances are considered detrimental. Particularly, rather than operating the amplifier of the pixel as a current amplifier, as in existing systems, transistor 18 is functioning as a voltage amplifier to increase charge of the data line capacitance $C_d$, and charge amplifier 28 also functioning in accordance with supplied charge. Therefore, in this mode of operation the amplifier select switch is used to convert the system that was originally designed for current based operation, to be used as a charge system.

In one design, pixels for imagers to which the present concepts may be applied may have approximately 1 pF capacity, whereas the data lines may have 20-100 pF or more capacity. This difference is therefore taken advantage of to produce improved operational results. For very large arrays, the improvement increases linearly.

Since the data line capacitance $C_d$ is much larger than the pixel capacitance $C_p$, in many designs it may be a thousand times larger, so in these systems the data line charge will be a thousand times greater than the pixel charge, resulting in a significant increase in signal gain. Thus, when a charge detector, which has a normal resolution of a thousand electrons, is used, and the noise signal, which also has about a thousand electrons, is multiplied by a thousand (i.e., the capacitance value of the data line), the signal level is a million electrons, which moves the signal into a range easily detectable by charge amplifier 28.

Returning attention to FIG. 4, it may be seen that the AMP RST, Select, and Sample signals are substantially the same as signals discussed in FIG. 2. Deactivation of AMP SEL signal 72 permits the pixel charge to accumulate in the data line capacitance ($C_d$). Once the signal has stabilized on the DATA line 48, SELECT signal 46 is deactivated and subsequently AMP SEL 72 is reactivated to allow the charge to be transferred from the data line capacitance ($C_d$) 24 to the charge amplifier capacitor $C_f$ 32. The output signal of the charge amplifier 28, AMP OUT signal 74, rises as $C_f$ charges. This data value may then be captured by a second activation of Sample signal 44Thus, rather than using the amplifier select switch 70 as a switch element to select a particular pixel from a plurality of pixels, it is used to generate gain to the data line signals to be sensed by charge amplifier 30.

As previously noted, FIG. 3 is a portion of an imager which would include a matrix having a plurality of pixels and associated circuitry. Numbers of these pixels are connected together to a single charge amplifier, such as charge amplifier 28. It is understood that this type of design would therefore benefit from a multiplexing scheme to reduce the number of charge amplifiers 28 needed to read a large array. In the present mode of operation, this multiplexing capability may be obtained, as is shown more particularly, for example, in FIG. 5. To attain the multiplexing along with the charge gain, each pixel is provided with an amplifier select switch 70.These switches are added to provide a multiplexing capability among a number of commonly connected pixels.

Thus, it is possible to use the forgoing concepts within a multiplexed system. In this design, the pixels charge up in parallel and then the select switches (e.g., 66a-66n) are appropriately activated. In most applications the select switches (e.g., 66a-66n) are connected together across the entire array and activated simultaneously. Activation of the AMP SEL switches (e.g. 70a-70n) are applied sequentially, therefore a select operation is performed on one pixel (e.g., 62a) which is then readout for a first data line (e.g., 22a) and the previously described operations are undertaken. Once data from a selected data line has been sensed by the charge amplifier 28, the operation moves on to a next data line. The multiplexed DATA lines 22a-22n are read from a single assertion of the SELECT signal 46 applied to switches 66a-66n. The system may subsequently address other columns.

The circuits shown in FIGS. 3 and 5 may, as previously noted, be used a flat panel imagers. An example of a flat panel imager to which the present application may be directed is discussed in more detail in the article, entitled "Flat Panel Imagers Based on Excimer Laser Annealed poly Si Thin Film Transistor Technology". This paper discusses the design and configuration of a flat panel imager based on Excimer Laser Annealing (ELA), poly-Si TFT technology. In this paper, FIG. 1b presents a diagram of such an imager, similarly, FIG. 3 shows a circuit diagram with pixel level source follower amplifier. The contents of this article are hereby incorporated by reference herein, in its entirety.

The invention has been described with reference to the preferred embodiments. Obviously modifications and alterations will occur to others upon reading and understanding the preceding detailed description. It is intended that the invention be construed as including all such modifications and alterations or the equivalents thereof in consideration of the material presented herein.

What is claimed is:

1. A method of operating a charge gain hybrid imaging system comprising:
    activating an amplifier reset switch to reset a charge amplifier;
    collecting a charge of a pixel of the imaging system;
    storing the collected pixel charge in a pixel capacitor ($C_p$);
    selecting the pixel via a pixel select switch;
    activating a pixel reset switch to reset the pixel;
    deactivating the amplifier reset switch, wherein a gate-source capacitive charge is injected into a front end of the charge amplifier;
    transferring the pixel charge stored on the pixel capacitor ($C_p$) to a data line capacitor ($C_d$) of a data line until a full data line charge, which is associated with an effective charge gain of $C_d/C_p$, is reached;
    activating an amplifier select switch connecting the data line to the charge amplifier, the gate-source capacitive charge detected by a first sampling action of a sample switch, wherein the active state of the amplifier select switch encompasses the first active state of the sample switch and the charge of the data line capacitance is transferred to the charge amplifier as the charge gain defined by the relationship $C_d/C_p$;
    sensing the data line charge by the charge amplifier;
    deactivating the amplifier select switch after the pixel is selected, to isolate the pixel from the charge amplifier; and
    activating the sample switch a second time, wherein an output of the charge amplifier due to the charge gain is detected.

2. The method according to claim 1, wherein use of data line capacitance provides noise-immunity, linear charge detection.

3. The method according to claim 1, wherein the step of selecting the pixel via the pixel select switch includes connecting a voltage amplifier of the pixel to a data line of the imaging system.

4. The method according to claim 3, wherein the step of connecting the voltage amplifier of the pixel to the data line includes charging the data line to a charge value greater than the pixel charge.

5. The method according to claim 1 further including:
reading a signal from the charge amplifier based on the sensed charge gain, and
converting the readout signal to a digital signal.

6. The method according to claim 1, wherein the pixel select switch is a transistor, and the step of selecting the pixel via the pixel select switch includes turning on the transistor by providing an input to the gate of the transistor.

7. The method according to claim 1, wherein the pixel charge collection may be by a photoconductor, photodiode, gap cell, or other charge-generating transducer.

8. The method according to claim 1, wherein the pixel is one of a plurality of pixels of a matrix of pixels, wherein each pixel of the matrix of pixels includes a transducer, a voltage amplifier and pixel capacitor.

9. The method according to claim 8, wherein an amplifier select switch is provided with each pixel or row of the matrix of pixels.

10. The method according to claim 9, wherein each row of the pixels of the matrix is selected by the amplifier select switch in sequence, wherein pixel charge from the selected pixels are transferred to the data line, and the charge gain for each pixel is then sensed by the charge amplifier, wherein each column comprised of rows is then selected.

11. A low noise hybrid imaging system comprising:
a pixel including,
a transducer configured to generate charge in relation to a received stimulus,
a pixel reset switch connected to a detector and to a discharge bus;
a pixel capacitor arranged to store the transducer output as a pixel charge on the capacitor ($C_p$),
a voltage amplifier connected to transfer the pixel voltage to a select switch,
a select switch line connected to the voltage amplifier via the select switch, wherein activating the select switch transfers the pixel voltage to the data tine and a data line charge is stored in a data line capacitor ($C_d$),
an amplifier select switch connected at one end to the data line, which may be used to multiplex a plurality of pixels or pixel rows;
a charge amplifier connected to a second end of the amplifier select switch, wherein, when the amplifier select switch is turned on, a full charge from the data line capacitor is sensed by the charge amplifier, the charge provided to the charge amplifier defined as the pixel charge multiplied by the data line capacitance ($C_d$) divided by the pixel capacitance ($C_p$); and
an external charge detector connected to the pixel, through use of a data line connector, the external charge detector comprised of a charge amplifier, a capacitance feedback, an amplifier reset switch, a sample and hold switch, and signal processing electronics.

12. The system according to claim 11, wherein a capacitance of the pixel capacitor and a capacitance of the data line capacitor may be one of parasitic capacitance or extrinsic capacitance.

13. The system according to claim 11 wherein the transistors of the system include at least one of a-Si, p-Si, or organic transistors.

14. The system according to claim 11, wherein the capacitance of the data line capacitor is used to generate noise-immune charge detection.

15. The system according to claim 11, wherein
the pixel is one of a plurality of pixels arranged in a matrix of pixels, and
the amplifier select switch is one of a plurality of amplifier select switches, each amplifier select switch associated with one of a plurality of charge amplifiers.

16. A method of operating a charge gain hybrid imaging system having at least one pixel which transmits signal data to a charge amplifier, comprising:
activating an amplifier reset switch to reset the charge amplifier;
activating a pixel reset switch to reset the pixel;
deactivating the amplifier reset switch, wherein a gate-source capacitive charge is injected into a front end of the charge amplifier;
activating a sample switch a first time, wherein the gate-source capacitive charge is detected by the first sampling action, wherein an active state of an amplifier select switch encompasses the first active state of the sample switch;
deactivating the amplifier select switch, isolating the pixel from the charge amplifier;
activating a pixel select switch, wherein charge from a pixel capacitance of the pixel is transferred to a data line capacitance of a data line until a full data line charge is reached, and wherein the amplifier select switch remains inactive while the pixel select switch is active;
activating the amplifier select switch, wherein the charge of the data line capacitance is transferred to the charge amplifier as a charge gain defined by the relationship $C_d/C_p$; and
activating the sample switch a second time, wherein an output of the charge amplifier due to the charge gain is detected.

17. The method according to claim 16, wherein use of the first pulsing of the sample switch and pulsing of the second sample switch perform double correlated sampling.

18. The method according to claim 16, wherein prior to the step of deactivating the amplifier reset switch, steps of
activating an amplifier reset switch to reset the charge amplifier, and
activating a pixel reset switch to reset the pixel, are performed.

19. The method according to claim 16, wherein the amplifier select switches may be used to multiplex a plurality of pixels or pixel rows to a lesser number of charge amplifiers.

* * * * *